United States Patent [19]
Yonemaru et al.

[11] Patent Number: 5,237,184
[45] Date of Patent: Aug. 17, 1993

[54] SEMICONDUCTOR INTEGRATED CIRCUIT

[75] Inventors: Masashi Yonemaru, Chiba; Yoshiki Shibata, Yotsukaido; Youichi Nakamura, Tsuchiura; Tamotsu Toyooka, Itabashi, all of Japan

[73] Assignee: Sharp Kabushiki Kaisha, Osaka, Japan

[21] Appl. No.: 804,753

[22] Filed: Dec. 11, 1991

[30] Foreign Application Priority Data

Dec. 15, 1990 [JP] Japan .................. 2-402537

[51] Int. Cl.⁵ ............ H01L 27/02; H01L 27/10; H01L 23/48; H01L 29/46
[52] U.S. Cl. .................. 257/202; 257/208; 257/211; 257/758
[58] Field of Search .......... 357/40, 45, 68, 71; 257/202, 203, 207, 208, 211, 758

[56] References Cited

FOREIGN PATENT DOCUMENTS 57-122051  7/1982  Japan .
59-163837  9/1984  Japan .
63-224238  9/1988  Japan .
63-304642  12/1988 Japan .
1-144649   6/1989  Japan .

Primary Examiner—Mark V. Prenty
Attorney, Agent, or Firm—Nixon & Vanderhye

[57] ABSTRACT

A semiconductor integrated circuit of the present invention features that a voltage is stably applied to a cell for high-speed operation and the number of lengthy wirings which run around a cell row is reduced without increasing a chip area, so that line efficiency can be improved. Since a power source line 16 and a ground line 17, each having a wide line running width, are formed on a top line layer above a cell 1 so as to cover nearly the whole surface of the cell 1, electrical resistance of the power source line 16 and the ground line 17 is reduced and then the voltage applied to the cell for high-speed operation is stabilized and such design is enabled without increasing the chip area. In addition, since penetrating lines 18 and 19 are formed on the lower line layer on a border between the cells, the number of lengthy lines which run around the cell row can be reduced by using the penetrating lines 18 and 19 as connecting between cells, so that line efficiency can be improved.

21 Claims, 9 Drawing Sheets

SEMICONDUCTOR INTEGRATED CIRCUIT

FIELD OF THE INVENTION

The present invention relates to a semiconductor integrated circuit and, more particularly, to a semiconductor integrated circuit of a gate array system and a standard cell system.

DESCRIPTION OF THE RELATED ART

Conventionally, in a case where a semiconductor integrated circuit is designed by a CAD (computer aided design), a cell system has been used in which a cell row is formed by arranging a plurality of cells which form a circuit having a specific function such as an inverter and the plurality of cell rows are arranged so as to be apart from each other with a predetermined distance to form a line area between the cell rows. In the cell system there are known a gate array system in which a cell area is previously fixed, and a standard cell system having a higher degree of freedom.

Figure 8:
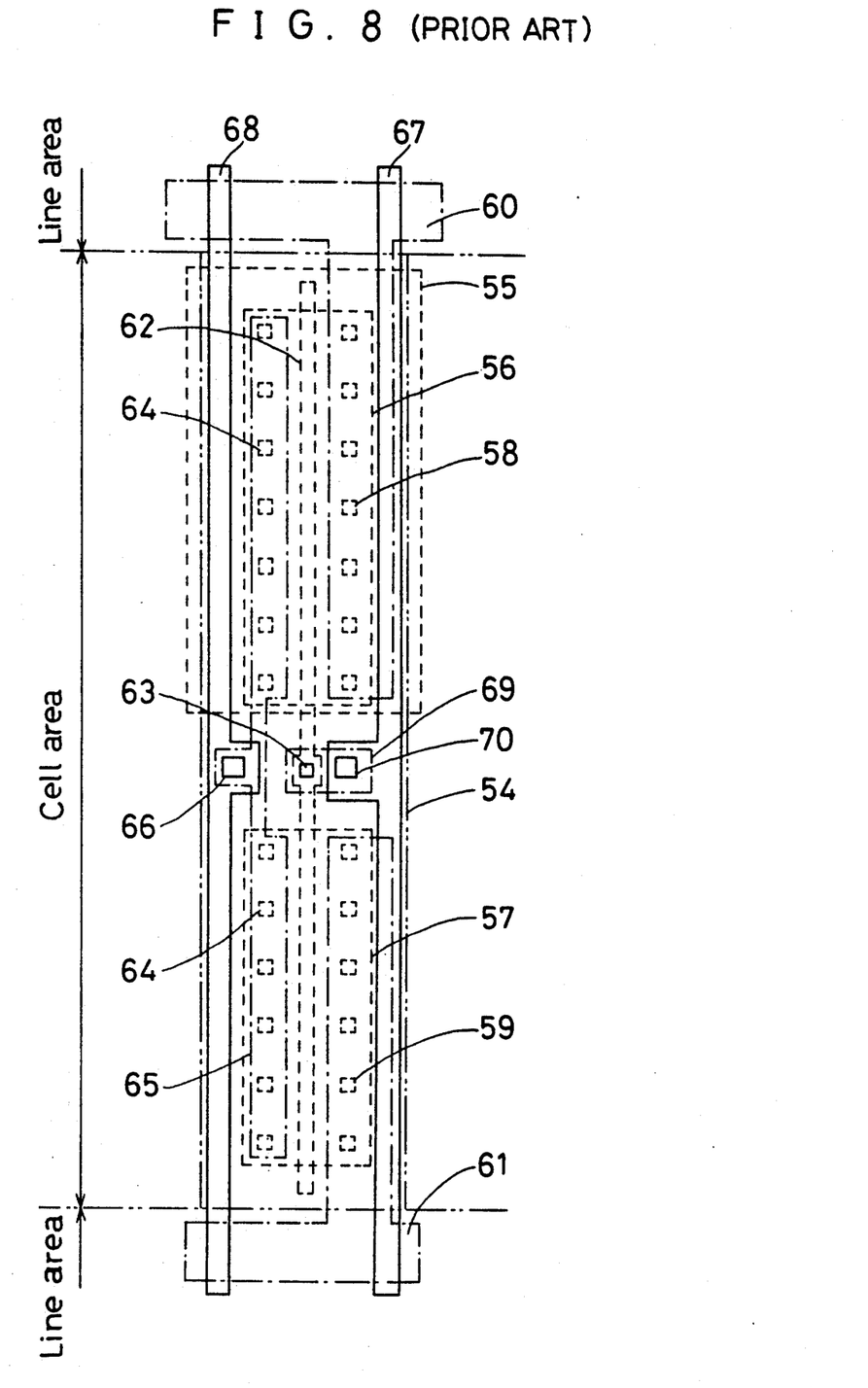
FIG. 8 is a view showing a structure of a cell of a conventional semiconductor integrated circuit.

FIG. 8 is a view showing a structure of a cell of a semiconductor integrated circuit using a conventional standard cell system. A layout shown of the cell of the semiconductor integrated circuit is drawn to a layout of an inverter logic cell.

Referring to FIG. 8, a rectangular area surrounded by a two-dotted line is a cell 54. Line areas are shown on two, top and bottom, sides of the cell 54 in a vertical direction. In the cell 54 are vertically arranged an active element area 56 of a p channel FET and an active element area 57 of an n channel FET which form a complementary MOS inverter. Reference numeral 55 designates an n well of the p channel FET. A gate 62 of the active element areas 56 and 57 is connected to a first layer line 69 through a contact 63 in the vicinity of the center of the cell 54 and to an input terminal line 67 of an upper layer through a contact 70. Multilayered line layers are formed on the upper layer of the active element areas 56 and 57 and the gate 62. The first layer line 69 is formed on a first lower layer (shown by a dotted line in FIG. 8) included in the multilayered line layers. In addition, the input terminal line 67 is formed on a second upper layer (shown by a solid line in FIG. 8) included in the multilayered line layers. The input terminal line 67 extends to line areas on the two vertical sides of the cell 54. The input terminal line 67 is an input terminal in a complementary MOS inverter.

A drain in the active element area 56 of the p channel FET and a drain of the active element area 57 of the n channel FET are connected to a first layer line 65 through a plurality of contacts 64. The first layer line 65 is formed on the first lower layer included in the multilayered line layers. Then, the first layer line 65 is connected to an output terminal line 68 of the upper layer through a contact 66 in the vicinity of the center of the cell 54. The output terminal line 68 is formed on a second upper layer included in the multilayered line layers. The output terminal line 68 extends to the line areas on two vertical sides of the cell 54 in parallel with the input terminal line 67. The output terminal line 68 is an output terminal in the complementary MOS inverter.

A source in the active element area 56 of the p channel FET is connected to a power source line 60 lying above the source through a plurality of contacts 58. In addition, a source in the active element area 57 of the n channel FET is connected to a ground line 61 lying above the source through a plurality of contacts 59. The power source line 60 and the ground line 61 are formed on the first lower layer included in the multilayered line layers. The power source line 60 connected to the source of the active element area 56 extends to reach one line area in a vertical direction in the first lower layer. The power source line 60 extending to the line area becomes a terminal for applying a power supply voltage to the cell 54. In addition, the ground line 61 connected to the source of the active element area 57 extends to reach the other line area in a vertical direction in the first lower layer. The ground line 61 extending to the line area becomes a terminal for applying a ground voltage to the cell 54.

Figure 9:
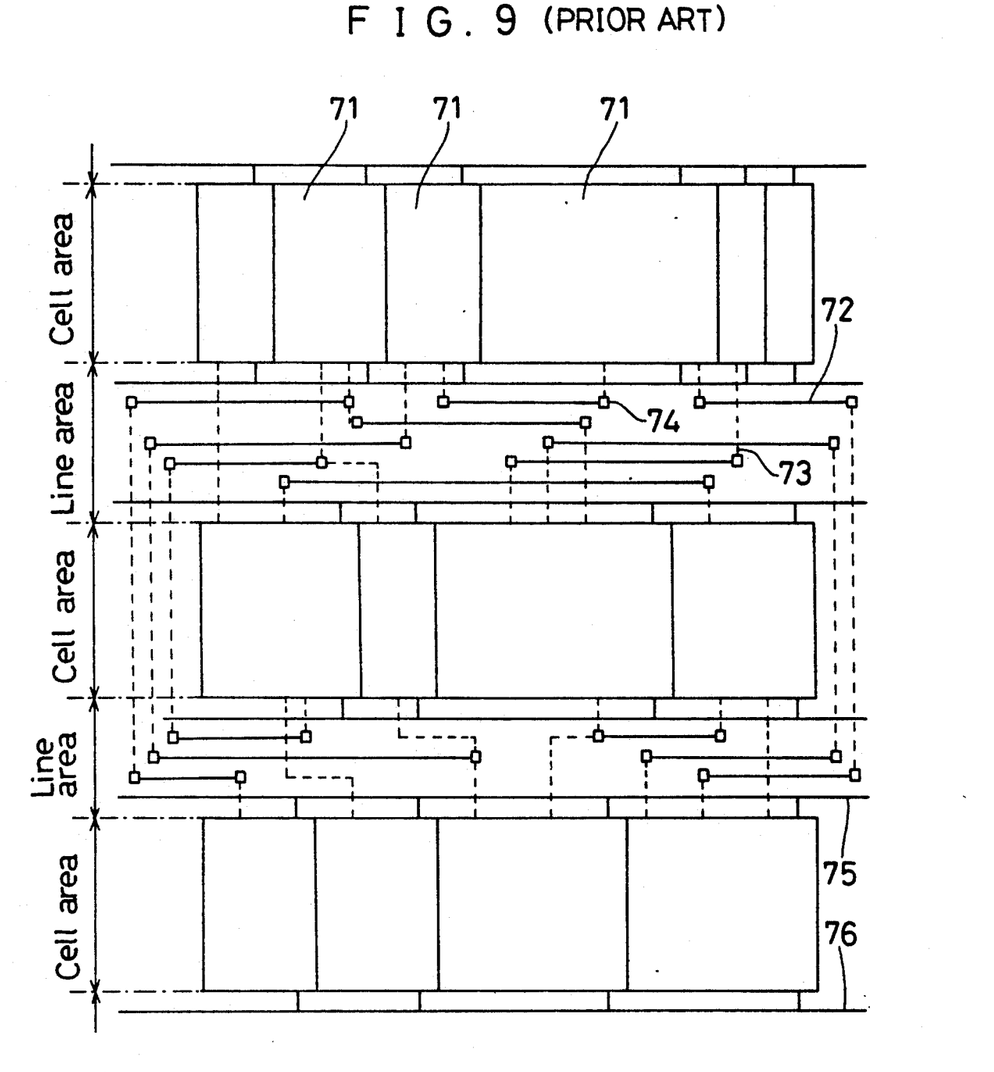
FIG. 9 is a view showing the conventional semiconductor integrated circuit.

Similar to the cell 54 shown in FIG. 8, FIG. 9 shows a semiconductor integrated circuit of a standard cell system, in which lines for applying a power source voltage and a ground voltage to a cell are formed on the line layer of the lower layer in the multilayered line layers and a cell each having a specific function is used. Referring to FIG. 9, reference numeral 71 designates a cell each having a specific function, reference numeral 72 designates a line pattern formed on a first lower layer included in the multilayered line layers, reference numeral 73 designates a line pattern formed on a second upper layer included in the multilayered line layers, reference numeral 74 designates a contact connecting the line pattern 72 formed on the first layer to the line pattern 73 formed on the second layer, reference numeral 75 designates a line pattern formed on the first lower layer included in the multilayered line layers to apply a power source voltage to the cell 71, and reference numeral 76 designates a line pattern formed on the first layer to apply a ground voltage to the cell 71.

A row of cells 71 in FIG. 9 forms a cell row and hence a cell area. In addition, a line area is formed between the cell rows. In the semiconductor integrated circuit shown in FIG. 9, three cell rows are used and on two sides of the middle cell row in a horizontal direction, five line patterns are run around the middle cell row.

However, there are following problems in the conventional semiconductor integrated circuit of the standard cell system.

First, since the line patterns 75 and 76 for applying a power source voltage and a ground voltage to the cell 71, respectively are in the line area, if each line width of the line patterns 75 and 76 is increased in order to make a power supply to the cell 71 stable, only the line area becomes wide, causing widening of a chip area. In addition, if each line width of the line patterns 75 and 76 is decreased, voltage fluctuation at the time of operation of the cell because of a current consumption forms large and then the operation of the cell becomes unstable, so that a demand for recent high-speed operation can not be met.

Secondly, according to a line structure shown in FIG. 9, since the line areas are necessary on both sides of the cell row so as to run around the cell row, line efficiency is bad and a line length is increased. Therefore, the chip area is widened and also line capacity is enlarged, which is unfavorable to high-speed operation.

In addition, as a related art, there is the automatic wiring design shown in Japanese Patent Laid Open No. 112051/1982. In No. 112051/1982 in an excess area in a fundamental cell a wiring which can be used as a wiring between cells is provided, and processing is done so that a plurality of lattice points at the end of the wiring may be taken as equivalent points viewed from the point of designing. The semiconductor integrated circuit shown in Japanese Patent Laid Open No. 163837/1984, in which the cell rows of the plural number are arranged densely leaving no space between them and electric power source lines (including a ground line) to be held in common by the adjoining cell lines are arranged on the boundary of the cell rows according to first layer metal wirings and cells are connected according to second and third layer metal wirings. The semiconductor integrated circuit shown in Japanese Patent Laid Open No. 224238/1988, in which a gap is provided between the fundamental cells of a gate array and wiring of the same layer as that of a gate electrode wiring is buried in the gap. The standard cell integrated circuit shown in Japanese Patent Laid Open No. 304642/1988, in which a specified cell among cells is provided with a signal line passing through the inside. The wiring structure of integrated circuit shown in Japanese Patent Laid Open No. 144649/1989, in which a wiring path of a signal line in the vertical direction in a wiring area is formed on the upper layer side of a multilayer interconnection layer of the wiring path in the vertical direction which draws the signal line from each cell to the wiring area and a wiring path supplying a power supply voltage and a ground voltage is formed in the multilayer interconnection layer in the cell area in the longitudinal direction.

SUMMARY OF THE INVENTION

It is an object of the present invention to provide a semiconductor integrated circuit capable of stably operating at high speed, in which a running width of lines for supplying a power source voltage and a ground voltage can be arranged efficient without widening a chip area and with reduction in the number of lengthy lines which run around a cell row, so that an operation speed is prevented from inefficiency because of increases of the chip area and a length of the line.

The present invention provides a semiconductor integrated circuit formed on a substrate for providing a target function including a cell row, arranged on the substrate, providing with cells each having elements, the cell rows in plurality being arranged to be apart from each other with a predetermined distance; and multilayered line layers, formed on the cell rows and a line area between the cell rows, for connecting the cells, a top line layer included in the multilayered line layers having a power source line for applying a power voltage to the cells in the cell rows and a ground line for applying a ground potential to the cells in the cell rows, the power source line and the ground line extending in a direction of the cell row and covering nearly the whole surface of the cell row, a lower line layer included in the multilayered line layers having a penetrating line which penetrates an upper area of a border between the cells in the cell row and a line for the element, formed on the cell, for connecting each element in the cell.

In addition, the plurality of cells are preferably standard cells each having a specific function.

Further, it is preferable that the cell row comprises a cell for a line and the line layer on the top layer on the cell for the line has the power source line and the ground line and also has a penetrating line which penetrates an upper area of the cell row between the cells for the line and the line layer on the top layer.

Still further, it is preferable that the gate array system in which the plurality of cells are fundamental cells all having the same structure is used.

According to the above structure, since the power source line and the ground line are on the line layer of the top layer among the multilayered line layers and cover almost the whole surface of the cell row, widths of the power source line and the ground line can be increased within a range such that the power source line and the ground line are inside the column cell in a direction vertical to a direction in which the cell row extends. Therefore, a stable voltage is supplied even when each cell of the cell row operates at high speed without increasing the line area and the chip area, so that each cell can stably operate. In addition, since the power source line and the ground line cover almost the whole surface of the cell row, an element in the cell of the cell row is shielded by the power source line and the ground line, so that a noise resistant function can be improved.

Further, since the power source line and the ground line cover almost the whole of the cell row, a degree of freedom of position setting of a contact between the power source line and the ground line is increased, so that line efficiency in the cell can be improved.

In addition, since the penetrating line which penetrates an upper area of a border between the cells in the cell row is on the line layer of the lower layer among the multilayered line layers, adjacent cells in the cell row or cells apart from each other in the row can be connected through the penetrating line. Thus, the number of the long lines which run around the cell row can be reduced, so that the line area becomes small, the line length can be reduced and line capacity is also reduced. As a result, there is provided a small-sized semiconductor integrated circuit capable of operating at high speed.

In a case where the plurality of cells are standard cells each having a specific function, the semiconductor integrated circuit is a semiconductor integrated circuit of the standard cell system.

Further, in a case where the cell row comprises a cell for a line and the line layer on the top layer on the cell for the line has the power source line and the ground line and also has a penetrating line which penetrates an upper area of the cell row between the cell for the line and the line layer on the top layer, since the penetrating line which penetrates the upper part of the cell for the line is on the lower part of the line layer on the top layer, adjacent cells of the cell row or the cell apart from each other in the cell row can be connected through not only the penetrating line which penetrates the upper area of a border between the cells but also the penetrating line which penetrates the upper part of the cell for the line. Therefore, since the number of the long lines which run around the cell row can be further reduced, the line area, the line length and the line capacity become further small. As a result, there can be provided the small-sized semiconductor integrated circuit capable of operating at high speed.

In addition, in a case the gate array system in which the plurality of cells are fundamental cells all having the same structures is used, the above semiconductor integrated circuit is a semiconductor integrated circuit of the gate array system.

DETAILED DESCRIPTION OF THE PREFERRED EMBODIMENT

An embodiment of the present invention will be described in reference to the drawings hereinafter.

Figure 1:
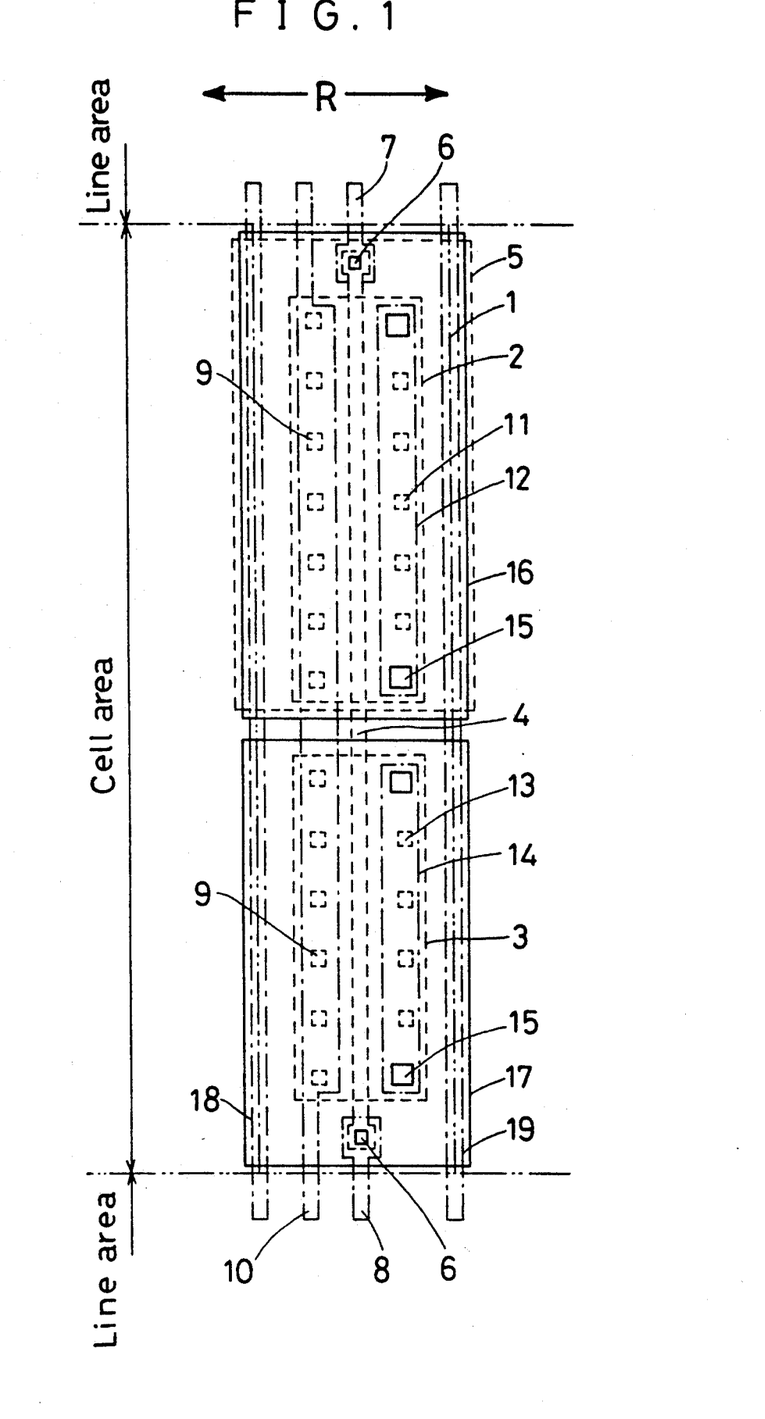
FIG. 1 is a view showing a structure of a cell of a semiconductor integrated circuit in accordance with a first embodiment of the present invention.
Figure 2:
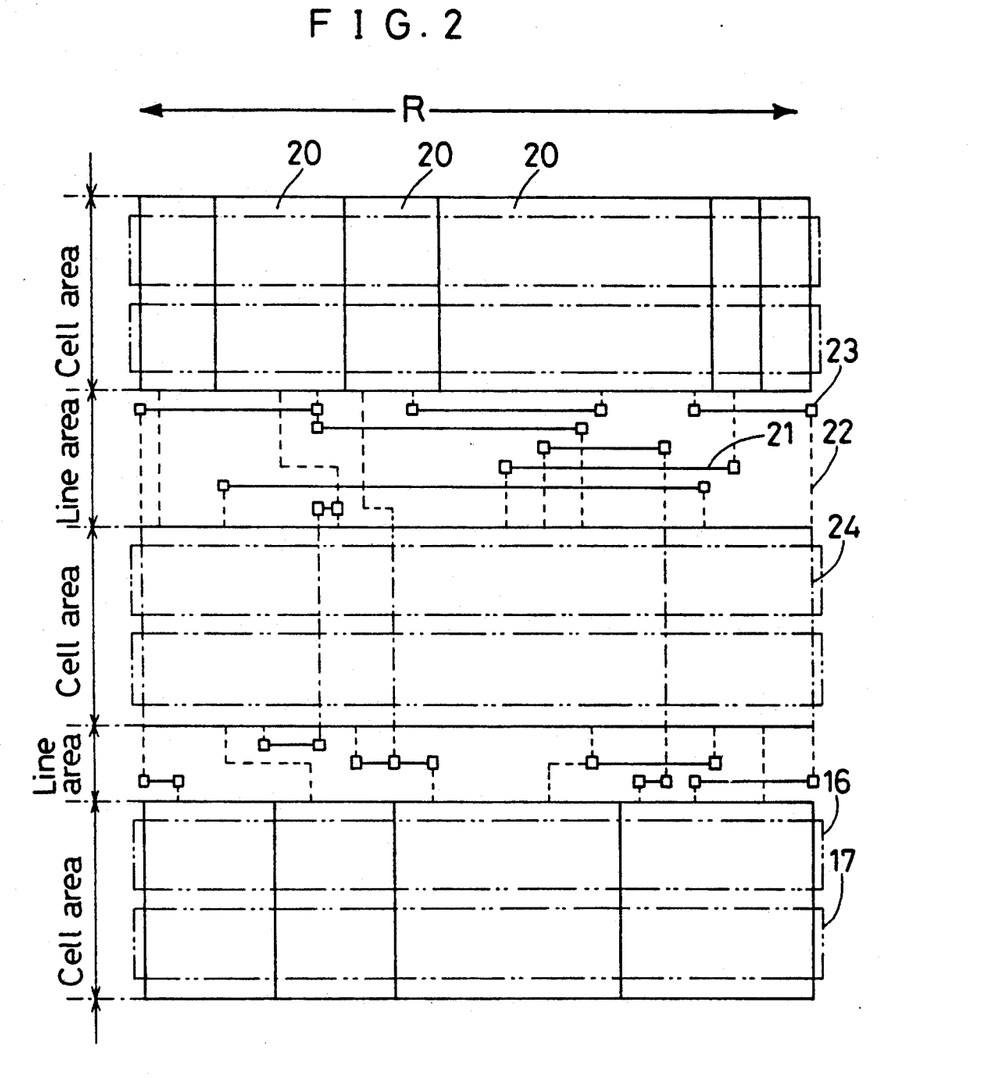
FIG. 2 is a view showing a part of the semiconductor integrated circuit in accordance with the first embodiment of the present invention.

FIG. 1 is a view showing a structure of a cell of a semiconductor integrated circuit in accordance with a first embodiment of the present invention. The semiconductor integrated circuit in this embodiment of the present invention is a semiconductor integrated circuit of a standard cell system. A layout of the cell is drawn to a layout of an inverter logic cell. In FIG. 1, a rectangular area surrounded by a two-dotted line is a cell 1. Both sides of the cell 1 in a vertical direction are line areas. In the cell 1 are vertically arranged an active element area 2 of a p channel FET and an active element area 3 of an n channel FET which form a complementary MOS inverter. A gate 4 of the active element areas 2 and 3 is formed of a polysilicon layer on the center of the cell 1. In addition, reference numeral 5 designates an n well of the p channel FET. The gate 4 is connected to input terminal lines 7 and 8 formed on a first lower metal line layer of the multilayered line layers through a contact 6. The input terminal lines 7 and 8 extending to the line area are input terminals of the cell 1 of the inverter logic cell. A drain of the active element area 2 of the p channel FET and a drain of the active element area 3 of the n channel FET are connected to an output terminal line 10 formed on the first lower metal line layer of the multilayered line layers through a plurality of contacts 9. Both ends of the output terminal line 10 in a vertical direction extend to the line areas and become an output terminal of the cell 1 serving as the inverter logic cell. A source of the active element area 2 of the p channel FET is connected to a first metal line 12 formed on the first lower metal line layer included in the multilayered line layers through a plurality of contacts 11. A source of the active element area 3 of the n channel FET is connected to a first metal line 14 formed on the first metal line layer through a plurality of contacts 13. The first metal line 12 is connected to a power source line 16 formed on a second metal line layer of the top line layer in the multilayered line layers through a contact 15. In addition, the first metal line 14 is connected to a ground line 17 formed on the second metal line layer through a contact 15. In addition, the power source line 16 and the ground line 17 are widely formed so as to cover almost the whole surface of the upper part of the cell 1. In fact, as shown in FIGS. 1 and 2, the power source line 16 and the ground line 17 are each formed to extend almost half the width of the cell (in a direction orthogonal to a row direction R). Moreover, as shown in FIGS. 1 and 2, the power source line 16 and the ground line 17 extend substantially over only the cell row rather than in the line area. Further, penetrating lines 18 and 19 are formed on the first lower metal line layer in the multilayered line layers on a border which cuts the power source line 16 and the ground line 17 at right angles.

Similar to the cell 1 shown in FIG. 1, FIG. 2 is a view showing a part of a semiconductor integrated circuit of the standard cell system in accordance with the first embodiment of the present invention, in which a wide line which applies a power source voltage and a ground voltage to a cell and covers almost the whole surface of the cell is formed on the top line layer in the multilayered line layers, a penetrating line which penetrates the upper part of a border between cells which cuts the wide line at right angles is formed on the lower line layer in the multilayered line layers and cells each having a specific function are used.

Referring to FIG. 2, reference numeral 20 designates a cell having a specific function, reference numeral 21 designates a second line pattern formed on a second metal line layer of the top line layer in the multilayered line layers, reference numeral 22 designates a first line pattern formed on a first lower metal line layer in the multilayered line layers, reference numeral 23 designates a contact connecting the first layer line pattern 22 to the second layer line pattern 21, reference numeral 24 designates a penetrating line for penetrating line which is arranged on a border between the cells and formed on the first metal line layer. In addition, reference numeral 16 designates a wide power source line for supplying a power source voltage to the cell 20, which is formed on the second metal line layer, reference numeral 17 designates a wide ground line for supplying a ground voltage to the cell 20, which is formed on the second metal line layer. A row of the cells 20 forms a cell row and hence a cell area. In addition, there is formed a line area between the cells.

According to the semiconductor integrated circuit of the standard system of the above structure, the power source line 16 and the ground line 17 are formed on the second metal line layer of the top line layer and they are widely formed so as to cover the cell area. Therefore, resistance of the power source line formed by the power source line 16 and the ground line 17 is reduced and then it is possible to control fluctuation of the power source voltage generated by a current consumed when the element in the cell 20 operates. In addition, since the widely formed power source line converts the upper part of the cell 20, a cell area and the line area can not be increased because of an existence of the power source line. Further, since the widely formed power source line shields the inside of the cell 20, noise resistance is increased.

In addition, since the penetrating line 24 which penetrates the border between the cells 20 is used as a line between cells, the number of the lines which run around the cell row and a line length is reduced, so that line capacity is reduced. That is an advantage for high-speed operation and the line area becomes small, so that a chip area can be reduced.

According to the semiconductor integrated circuit of the standard cell system, the cell and the line are automatically arranged and connected by a CAD so as to be an objective circuit. At this time, the penetrating line set on the border of the cells is recognized by the CAD and automatically arranged and connected to be used as the line between cells as occasion arises.

When the semiconductor integrated circuit of the standard cell system is automatically arranged and connected by the CAD, a lattice coordinate is set as a positional reference of the line to be arranged. In this automatic arrangement and connecting, a line in a vertical direction and a line in a horizontal direction are formed on the different line layers and connected on a lattice line. Then, a contact connecting both lines is arranged at a lattice point of the lattice line. In this case, a distance between the lattice lines is set at an optimal value with regard to a width of the line, space between the lines, a size of a contact, its distance or the like, which is no problem from a viewpoint of a design rule. Therefore, the cell of the semiconductor integrated circuit of the standard cell system which is connected by the above automatic arrangement and connecting, its input/output terminal or the like has to be on the lattice coordinates. In addition, space where the element does not exist is necessary in the vicinity of the border in a direction of the row of cells so that an element of the cell may not extend to the adjacent cell. Further, since a width of the cell in its arranged direction is regulated by a multiple of the distance between the lattice lines, the space where the element does not exist is likely to be generated. Therefore, even if the penetrating line is arranged on almost all of the border lines between cells, it is not necessary to increase the cell area in many cases. In addition, even if the cell area is increased, since the cell is magnified only by almost one time as much as the distance between the lattice lines in many cases, a chip area reducing effect generated as line efficiency is improved because of an increase of the penetrating lines is advantageous and then the chip area is not increased.

Figure 3:
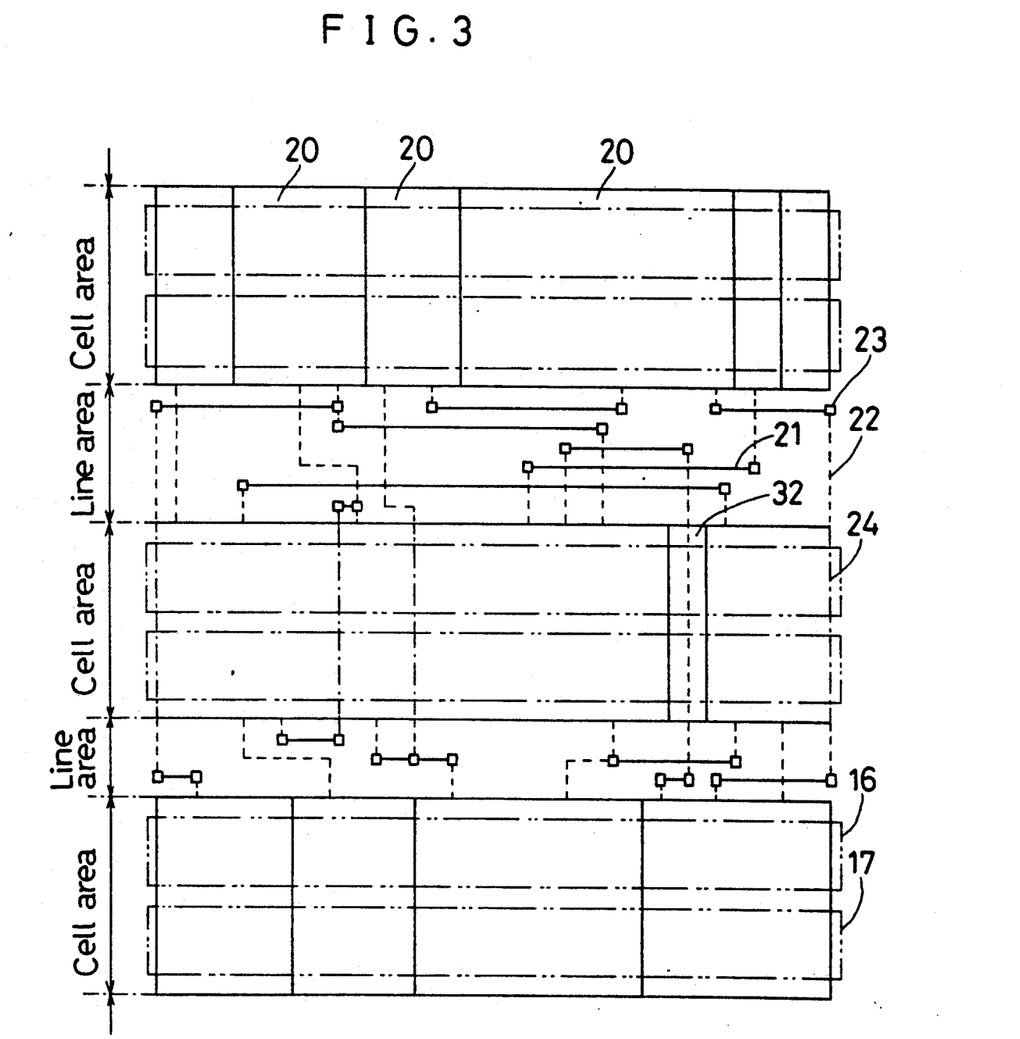
FIG. 3 is a view showing a part of a semiconductor integrated circuit in accordance with a second embodiment of the present invention.

Next, FIG. 3 shows a second embodiment of the present invention. This embodiment is different from the first embodiment in that the cell row comprises a cell 32 for a line. The same parts as in the first embodiment are allotted to the same reference numerals and that different point will be described in detail.

Figure 4:
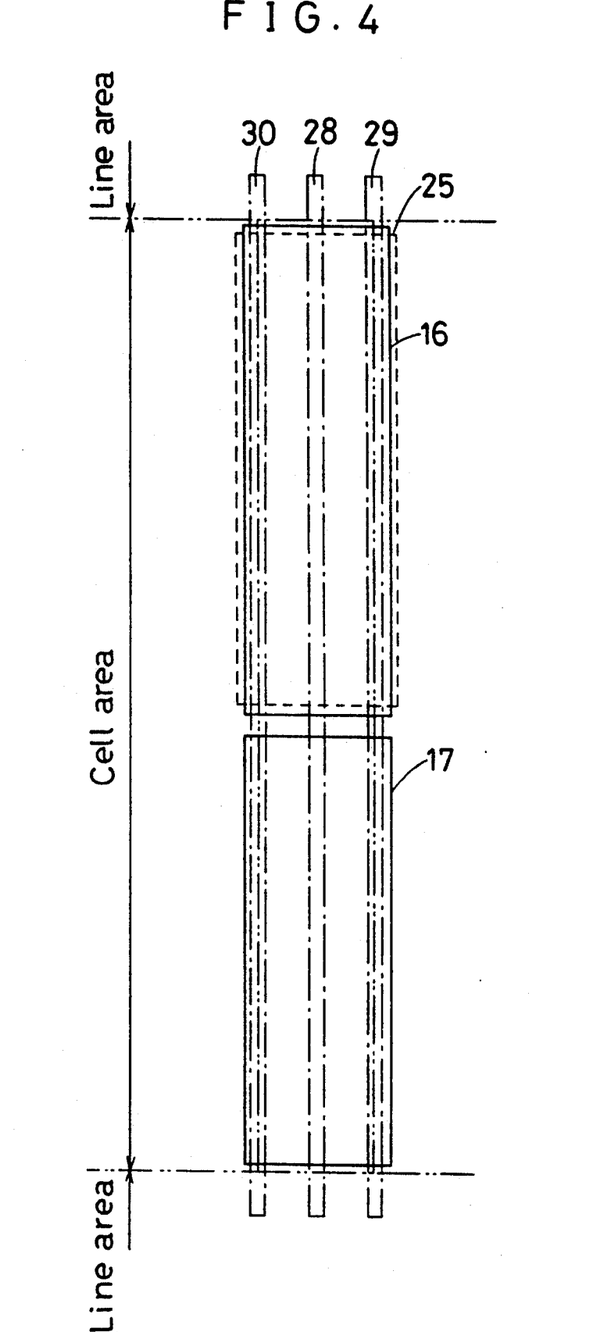
FIG. 4 is a view showing a structure of a cell for a line in accordance with the second embodiment of the present invention.

FIG. 4 shows a layout of the cell 32 for the line. Referring to FIG. 4, reference numeral 25 designates an n well of a p channel FET, reference numeral 16 designates a power source line for supplying a power source voltage, which is formed on a second metal line layer of a top line layer in a multilayered line layers. In addition, reference numeral 17 designates a ground line for supplying a ground voltage which is formed on the second metal line layer, reference numeral 28 designates a penetrating line which penetrates an upper area of the cell 32, which is formed on a first lower metal line layer in the multilayered line layers and reference numerals 29 and 30 designate penetrating lines formed on the first metal line layer on a border between the cells 32 for the line.

FIG. 3 is a view showing a part of a semiconductor integrated circuit in accordance with the second embodiment of the present invention, which has a cell 32 for the line and connected by an automatic arrangement and connecting Referring to FIG. 3, reference numeral 20 designates a cell having a specific function, reference numeral 32 designates a cell for a line, reference numeral 22 designates a first layer line pattern formed on the first metal line layer, reference numeral 21 designates a second layer line pattern formed on the second metal line layer, reference numeral 23 designates a contact connecting the first layer line pattern 22 to the second layer line pattern 21 and reference numeral 16 designates a power source line for supplying a power source voltage, which is formed on the second metal line layer. In addition, reference numeral 17 designates a ground line for supplying a ground voltage, which is formed on the second metal line layer. Reference numeral 24 designates a penetrating line set on a border between the cells. According to the second embodiment of the present invention, similar to the first embodiment of the present invention, the penetrating line 24 is set on the border between the cells and then the penetrating line 24 can be used as a line. In addition, according to the second embodiment of the present invention, even if the line is necessary more than that, since the penetrating line 28 which penetrates the upper part of the cell 32 is provided so that a line length may not be increased, the penetrating line 28 and the penetrating line 24 on the border between the cells are used together as the lines and automatically arranged and connected. As a result, line efficiency can be more improved.

Figure 5:
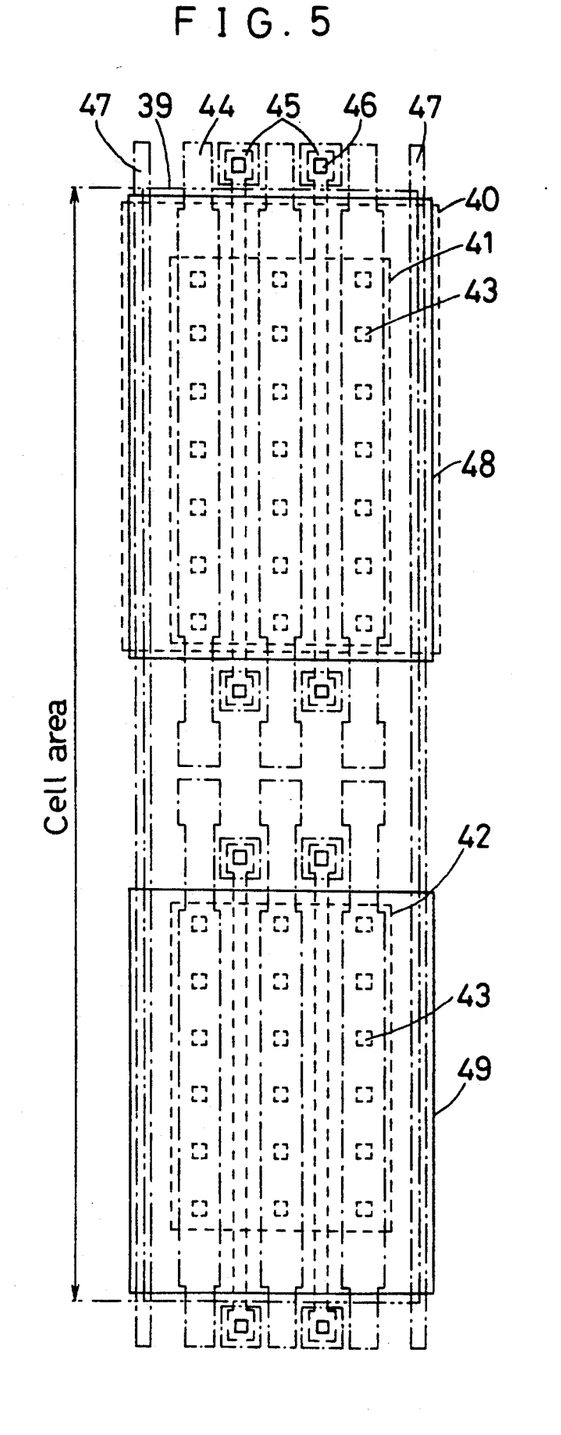
FIG. 5 is a view showing a structure of a fundamental cell in accordance with a third embodiment of the present invention.
Figure 6:
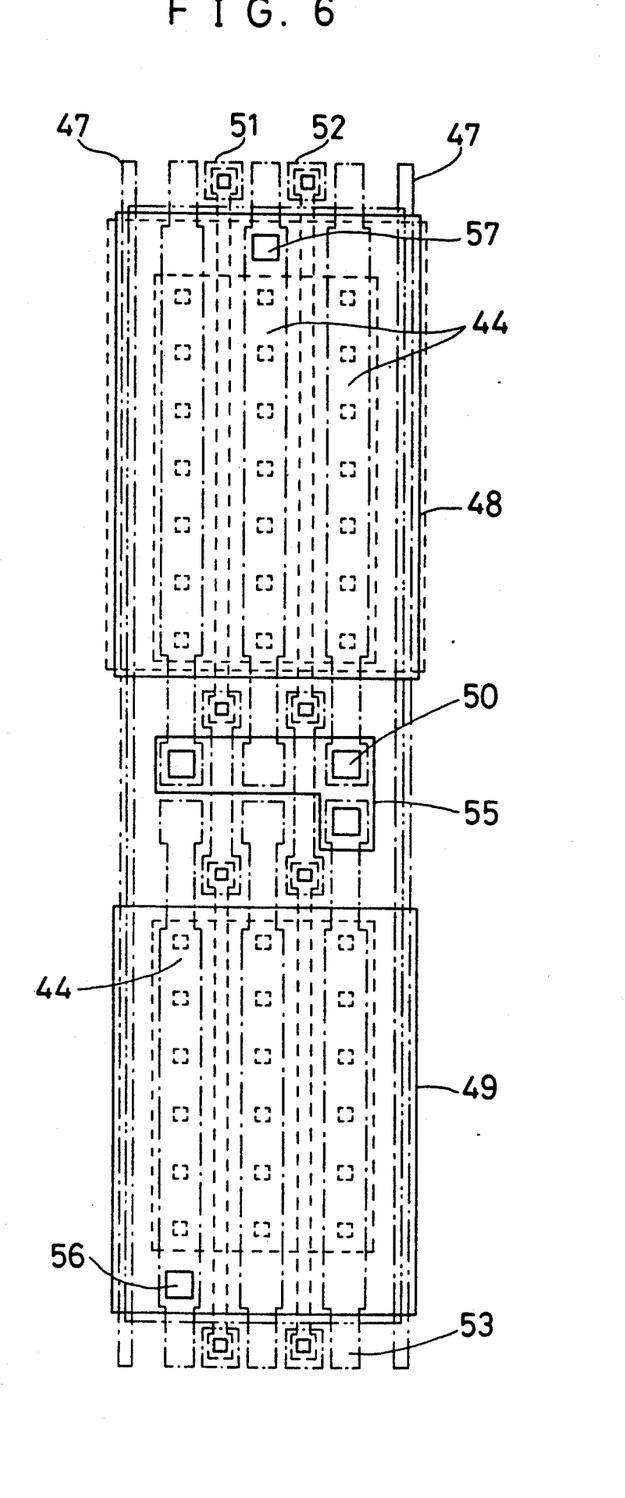
FIG. 6 is a view showing a two-input NAND structured using the fundamental cell in accordance with the third embodiment of the present invention.
Figure 7:
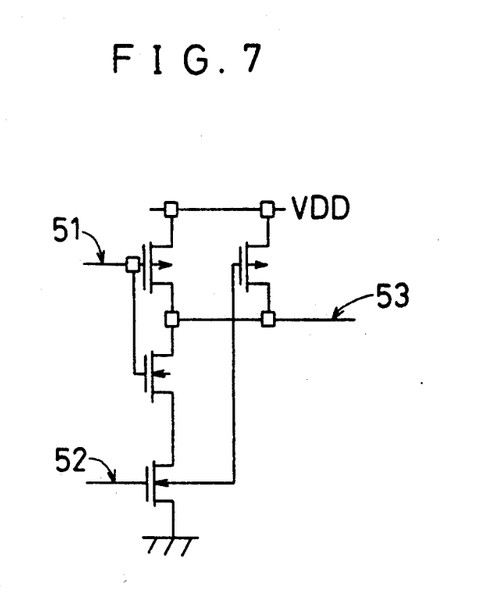
FIG. 7 is a circuit diagram of the two-input NAND.

Next, a third embodiment of the present invention will be described. A semiconductor integrated circuit in the third embodiment is a gate array system and a plurality of cells comprised in the semiconductor integrated circuit are fundamental cells all of which have the same structure. FIG. 5 shows the fundamental cell of the third embodiment of the present invention. In addition, FIG. 6 is a view showing a structure of a two-input NAND using the fundamental cell. Referring to FIG. 5, reference numeral 39 designates the fundamental cell (shown by an area surrounded by a two-dotted line), reference numeral 40 designates an n well of a p channel FET, reference numeral 41 designates an active element area of a p channel FET and reference numeral 42 designates an active element area of an n channel FET. A contact 43 connects sources and drains of the active element areas 41 and 42 of the p channel FET and the n channel FET, respectively to a terminal line 44 serving as a line for an element, which is formed on a first lower metal line layer in the multilayered line layers. A contact 46 connects a gate 45 of the p channel FET to terminals 51 and 52 which are formed on the first metal line layer and shown in FIG. 6. A contact 50 connects the terminal line 44 on the first metal line layer to a line 55 for an element formed on a second metal line layer of a top line layer in the multilayered line layers. In addition, a contact 56 connects the terminal line 44 to a wide ground line 49 formed on the second metal line layer. Contact 57 connects the terminal line 44 to a wide power source line 48 formed on the second metal line layer. In addition, a penetrating line 47 is formed on the second metal line layer on the border between cells. When the fundamental cell shown in FIG. 5 is connected as shown in FIG. 6, the NAND gate shown in FIG. 7 can be structured. Referring to FIG. 7, reference numerals 51 and 52 designate input terminals and reference numeral 53 designates an output terminal. The semiconductor integrated circuit having the above arranged fundamental cells is prepared as a master slice and the semiconductor integrated circuit having a desired function of the above embodiment can be formed by automatically connecting the master slice.

According to the embodiment of the gate array system, similar to the first embodiment of the present invention, since the wide power source line 48 and the ground line 49 cover almost the whole surface of the fundamental cell, a stable voltage can be applied to the fundamental cell during high-speed operation and it is possible to reduce the number of the long lines which run around the cell row by using the penetrating line 47 on the border between cells as the line between the cell rows having the fundamental cells. Therefore, according to the third embodiment of the present invention, the small-sized semiconductor integrated circuit of the gate array system, which can stably operate at high speed and has high noise resistance can be implemented.

As can be seen from the above description, according to the semiconductor integrated circuit of the present invention, the power source line and the ground line are formed on the top line layer in the multilayered line layers and cover almost the whole of the cell row, so that the power source line and the ground line can be widely formed in a direction vertical to a direction where the cell row extends within a range such that they are inside the cell row. Therefore, according to the present invention, there can be provided a semiconductor integrated circuit in which a stable voltage can be applied to the cell during high-speed operation. In addition, since the power source line and the ground line cover almost the whole surface of the cell row, an element in the cell of the cell row is shielded by the power source line and the ground line. As a result, noise resistance can be improved. Further, since the power source line and the ground line cover almost the whole surface of the cell row, it is possible to increase a degree of freedom in setting a position of a contact between the element in the cell of the cell row and the power source line and the ground line. As a result, line efficiency in the cell can be improved. Still further, since the penetrating line which penetrates the upper area of the border between the cells in the cell row is formed on the lower line layer in the multilayered line layers, adjacent cells or cells apart from each other in the cell row can be connected through the penetrating line. Thus, the number of the long lines running around the cell row can be reduced and the line area and the line capacity can be small. As a result, there can be provided a small-sized semiconductor integrated circuit capable of operating at high speed.

In addition, in a case the plurality of cells are standard cells each having a specific function, the semiconductor integrated circuit can be the semiconductor integrated circuit of the standard cell system.

Further, in a case where the cell row comprises a cell for a line and the line layer of the top layer on the cell for the line has the power source line and the ground line and has a penetrating line which penetrates an upper area of the cell row between the cell for the line and the line layer of the top layer, adjacent cells or cells apart from each other in the cell row can be connected through not only the penetrating line which penetrates the upper area of the border between the cells but also the penetrating line which penetrates the upper part of the cell for the line. Therefore, the number of the long lines which run around the cell row can be further reduced and the line area and the line capacity can be small. As a result, there can be provided a small-sized semiconductor integrated circuit capable of operating at higher speed.

In addition, in a case where the gate array system in which the plurality of cells are fundamental cells all of which have the same structure is used, the semiconductor integrated circuit can be the semiconductor integrated circuit of the gate array system.

While only certain presently preferred embodiments have been described in detail, as will be apparent with those skilled in the art, certain changes and modifications can be made without departing from the scope of the invention as defined by the following claims.

What is claimed is:

1. A semiconductor integrated circuit formed on a substrate for providing a target function comprising:
   a plurality of cell rows arranged on the substrate, each cell row having a plurality of cells extending in a row direction, each cell having semiconductor elements, said cell rows being spaced apart from each other by a predetermined distance;
   a line area provided between adjacent cell rows;
   a plurality of electrically connecting line layers for connecting the cells, the line layers being formed on the cell rows and the line area between the cell rows, wherein the plurality of line layers includes:
   a top line layer having:
      a power source line for applying a power voltage to the cells in the rows; and
      a ground line for applying a ground potential to the cells in the cell rows;
      said power source line and said ground line extending in the row direction and substantially covering a surface of the cell row;
   a lower line layer having a line which extends in a direction orthogonal to the row direction.

2. A semiconductor integrated circuit as set forth in claim 1, wherein said plurality of cells are standard cells each having a specific function.

3. A semiconductor integrated circuit as set forth in claim 1, wherein said plurality of cells comprise a gate array system, and wherein a plurality of the cells have substantially identical element structure.

4. A semiconductor integrated circuit as set forth in claim 1, wherein at least one of the power source line and the ground line are formed to extend almost half a width of the cell in a direction orthogonal to the row direction.

5. A semiconductor integrated circuit as set forth in claim 1, wherein the lower line layer includes a source connecting line for connecting a cell element to the power source line and a ground connecting line for connecting a cell element to the ground line, the source connecting line and the ground connecting line extending in a direction orthogonal to the row direction.

6. A semiconductor integrated circuit as set forth in claim 1, wherein the lower line layer includes a penetrating line for connecting semiconductor devices of cells other than the cell which it penetrates.

7. A semiconductor integrated circuit as set forth in claim 6, wherein the penetrating layer is formed proximate a boarder of the cell which it penetrates.

8. A semiconductor integrated circuit as set forth in claim 1, wherein a cell row includes a cell dedicated to have a penetrating line in the lower line layer, the penetrating line serving to connect semiconductor devices of cells other than the cell which it penetrates.

9. A semiconductor integrated circuit as set forth in claim 1, wherein both the source line and the ground line extend substantially over only the cell row.

10. A semiconductor integrated circuit formed on a substrate for providing a target function comprising:
   a plurality of cell rows arranged on the substrate, each cell row having a plurality of cells extending in a row direction, each cell having semiconductor elements, said cell rows being spaced apart from each other by a predetermined distance;
   a line area provided between adjacent cell rows;
   a plurality of electrically connecting line layers for connecting the cells, the line layers being formed on the cell rows and the line area between the cell rows, wherein the plurality of line layers includes:
      a top line layer having:
         a power source line for applying a power voltage to the cells in the cell rows; and
         a ground line for applying a ground potential to the cells in the cell rows;
         said power source line and said ground line extending in the row direction and wherein at least one of the power source line and the ground line extend substantially over only the cell row;
      a lower line layer having a penetrating line which extends between adjacent cells in a row in a direction orthogonal to the row direction.

11. A semiconductor integrated circuit as set forth in claim 10, wherein both the power source line and the ground line extend substantially over only the cell row.

12. A semiconductor integrated circuit as set forth in claim 10, wherein at least one of the power source line and the ground line are formed to extend almost half a width of the cell in a direction orthogonal to the row direction.

13. A semiconductor integrated circuit as set forth in claim 10, wherein the lower line layer includes a source connecting line for connecting a cell element to the power source line and a ground connecting line for connecting a cell element to the ground line, the source connecting line and the ground connecting line extending in a direction orthogonal to the row direction.

14. A semiconductor integrated circuit as set forth in claim 10, wherein said plurality of cells are standard cells each having a specific function.

15. A semiconductor integrated circuit as set forth in claim 10, wherein said plurality of cells comprise a gate array system, and wherein a plurality of the cells have substantially identical element structure.

16. A semiconductor integrated circuit formed on a substrate for providing a target function comprising:
   a plurality of cell rows arranged on the substrate, each cell row having a plurality of cells extending in a row direction, each cell having semiconductor elements, said cell rows being spaced apart from each other by a predetermined distance;
   a line area provided between adjacent cell rows;
   a plurality of electrically connecting line layers for connecting the cells, the line layers being formed on the cell rows and the line area between the cell rows, wherein the plurality of line layers includes:
      a top line layer having:
         a power source line for applying a power voltage to the cells in the cell rows; and
         a ground line for applying a ground potential to the cells in the cell rows;
         said power source line and said ground line extending in the row direction and wherein at least one of the power source line and the ground line are formed to extend almost half a width of the cell in a direction orthogonal to the row direction;
   a lower line layer having a line which extends in a row in a direction orthogonal to the row direction.

17. A semiconductor integrated circuit as set forth in claim 16, wherein the lower line layer includes a penetrating line for connecting semiconductor devices of cells other than the cell which it penetrates.

18. A semiconductor integrated circuit as set forth in claim 17, wherein the penetrating line is formed proximate a boarder of the cell which it penetrates.

19. A semiconductor integrated circuit as set forth in claim 16, wherein a cell row includes a cell dedicated to have a penetrating line in the lower line layer, the penetrating line serving to connect semiconductor devices of cells other than the cell which it penetrates.

20. A semiconductor integrated circuit as set forth in claim 16, wherein said plurality of cells are standard cells each having a specific function.

21. A semiconductor integrated circuit as set forth in claim 16, wherein said plurality of cells comprise a gate array system, and wherein a plurality of the cells have substantially identical element structure.

* * * * *